(12) United States Patent
Bakhishev et al.

(10) Patent No.: US 9,299,801 B1
(45) Date of Patent: Mar. 29, 2016

(54) METHOD FOR FABRICATING A TRANSISTOR DEVICE WITH A TUNED DOPANT PROFILE

(71) Applicant: MIE Fujitsu Semiconductor Limited, Kuwana (JP)

(72) Inventors: Teymur Bakhishev, San Jose, CA (US); Sameer Pradhan, San Jose, CA (US); Thomas Hoffmann, Los Gatos, CA (US); Sachin R. Sonkusale, Los Gatos, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 505 days.

(21) Appl. No.: 13/828,262

(22) Filed: Mar. 14, 2013

(51) Int. Cl.
*H01L 21/336* (2006.01)
*H01L 29/66* (2006.01)

(52) U.S. Cl.
CPC ................................. *H01L 29/66477* (2013.01)

(58) Field of Classification Search
CPC ..................................................... H01L 21/336
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |

(Continued)

FOREIGN PATENT DOCUMENTS

| EP | 0274278 | 7/1988 |
|---|---|---|
| EP | 0312237 | 4/1989 |

(Continued)

OTHER PUBLICATIONS

Abiko, H et al., "A Channel Engineering Combined with Channel Epitaxy Optimization and TED Suppression for 0.15 μ n-n Gate CMOS Technology", 1995 Symposium on VLSI Technology Digest of Technical Papers, pp. 23-24, 1995.

(Continued)

*Primary Examiner* — Marvin Payen
(74) *Attorney, Agent, or Firm* — Baker Botts L.L.P.

(57) ABSTRACT

A transistor device with a tuned dopant profile is fabricated by implanting one or more dopant migrating mitigating material such as carbon. The process conditions for the carbon implant are selected to achieve a desired peak location and height of the dopant profile for each dopant implant, such as boron. Different transistor devices with similar boron implants may be fabricated with different peak locations and heights for their respective dopant profiles by tailoring the carbon implant energy to effect tuned dopant profiles for the boron.

14 Claims, 7 Drawing Sheets

(56) References Cited

U.S. PATENT DOCUMENTS

| | | |
|---|---|---|
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 1,515,920 A | 11/2000 | Gossmann et al. |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |

(56) References Cited

U.S. PATENT DOCUMENTS

| | | | |
|---|---|---|---|
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,972,223 B2 | 12/2005 | Weimer et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,339,215 B2 | 3/2008 | Chidambaram |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,524,740 B1 | 4/2009 | Liu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,553,717 B2 | 6/2009 | Chakravarthi et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,631 B2 | 3/2010 | Murthy et al. |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |

(56) References Cited

U.S. PATENT DOCUMENTS

| | | |
|---|---|---|
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 | 9/2012 | Thompson et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0024876 A1 | 2/2006 | Chidambaram et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0194069 A1 | 8/2008 | Surdeanu et al. |
| 2008/0197439 A1 | 8/2008 | Goerlach et al. |
| 2008/0199999 A1 | 8/2008 | Weijtmans et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0079008 A1 | 3/2009 | Nandakumar et al. |
| 2009/0081858 A1 | 3/2009 | Qin et al. |
| 2009/0108350 A1 | 4/2009 | Cai et al. |
| 2009/0134468 A1 | 5/2009 | Tsuchiya et al. |
| 2009/0179280 A1 | 7/2009 | Kohli et al. |
| 2009/0224319 A1 | 9/2009 | Kohli |
| 2009/0278209 A1 | 11/2009 | Noda |
| 2009/0286367 A1 | 11/2009 | Krull et al. |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0078729 A1 | 4/2010 | Fukutome et al. |
| 2010/0100856 A1 | 4/2010 | Mittal |
| 2010/0133624 A1 | 6/2010 | Nandakumar et al. |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2010/0276761 A1 | 11/2010 | Tung et al. |

(56) References Cited

U.S. PATENT DOCUMENTS

| | | |
|---|---|---|
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175140 A1 | 7/2011 | Taylor et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0161210 A1 | 6/2012 | Heinrich et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO 2005/093831 | 10/2005 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-on-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951.

Hori, et al., "A 0.1 µm CMOS with a Step Channel Profile Formed by Ultra High Vacuum CVD and in-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798.

Komaragiri, R. et al., "Depletion-Free Poly Gale Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

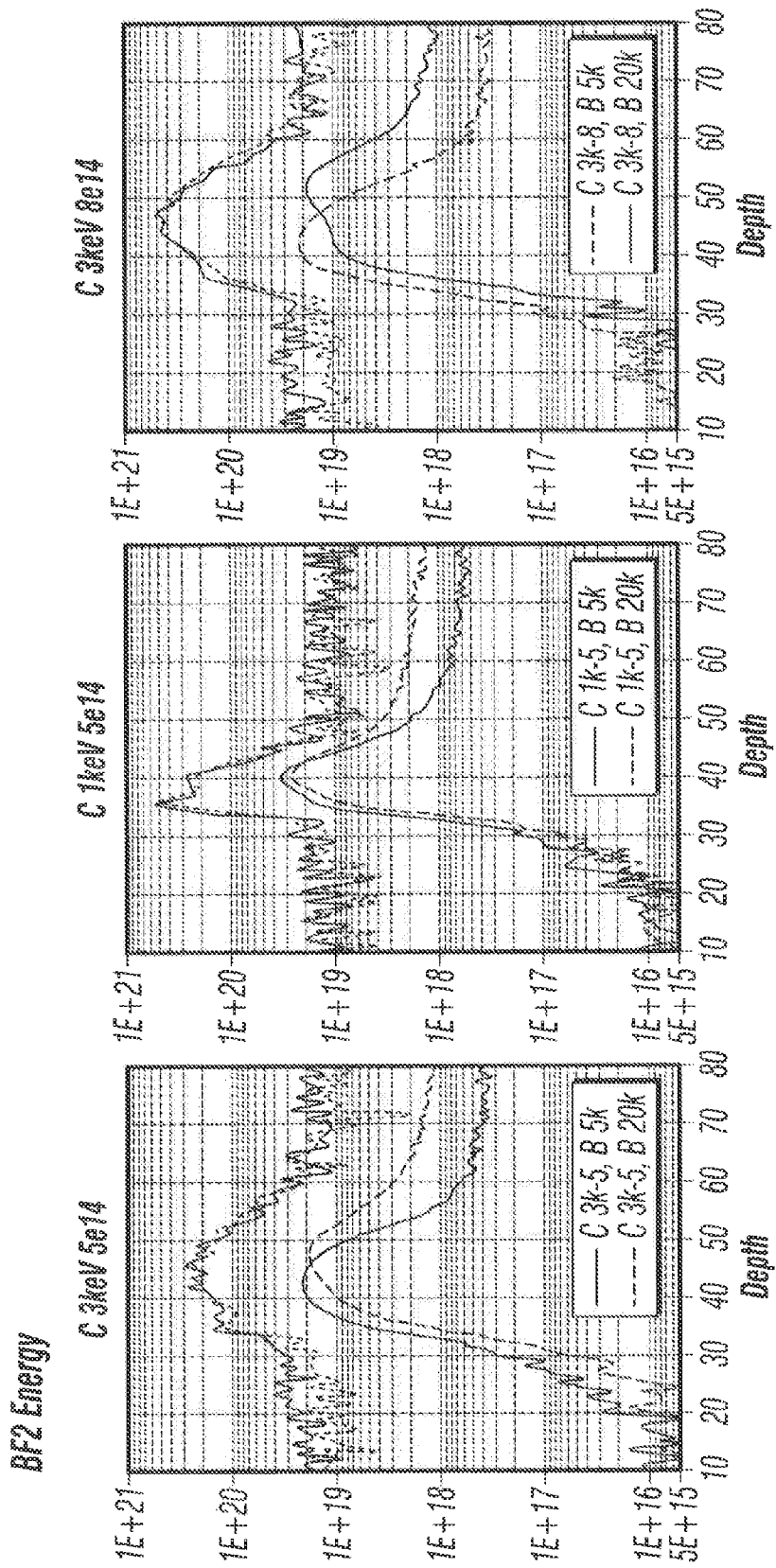

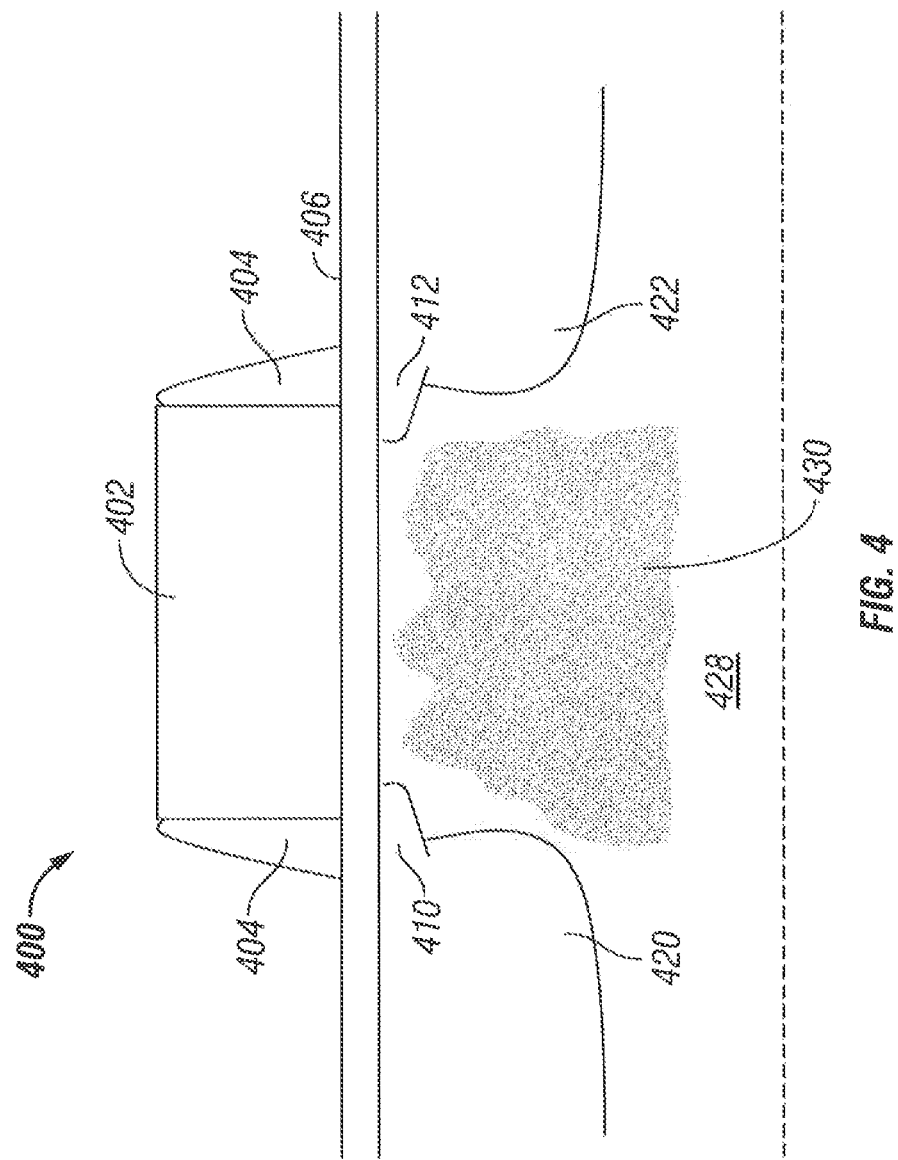

METHOD FOR FABRICATING A TRANSISTOR DEVICE WITH A TUNED DOPANT PROFILE

TECHNICAL FIELD

The present disclosure relates in general to semiconductor fabrication processes and more particularly to a method for fabricating a transistor device with a tuned dopant profile.

BACKGROUND

Cost effective semiconductor electronic manufacturing requires transistor structures and manufacturing processes that are reliable at nanometer scales and that do not require expensive or unavailable tools or process control conditions for the design or manufacture. While it is difficult to balance the many variables that control transistor electrical performance, finding suitable transistor dopant structures with an associated manufacturing technique that results in acceptable electrical characteristics such as charge carrier mobility, threshold voltage levels, and junction leakage are a key aspect of such commercially useful transistors.

BRIEF DESCRIPTION OF THE DRAWINGS

For a more complete understanding of the present disclosure, reference is now made to the following description taken in conjunction with the accompanying drawings, wherein like reference numerals represent like parts, in which:

FIGS. 1A-1C illustrate how a carbon implant may be used to adjust a dopant profile of a boron implant;

FIG. 4 illustrates an example of a transistor structure without a screening layer, with carbon added to the channel.

DETAILED DESCRIPTION

Figure 2A:
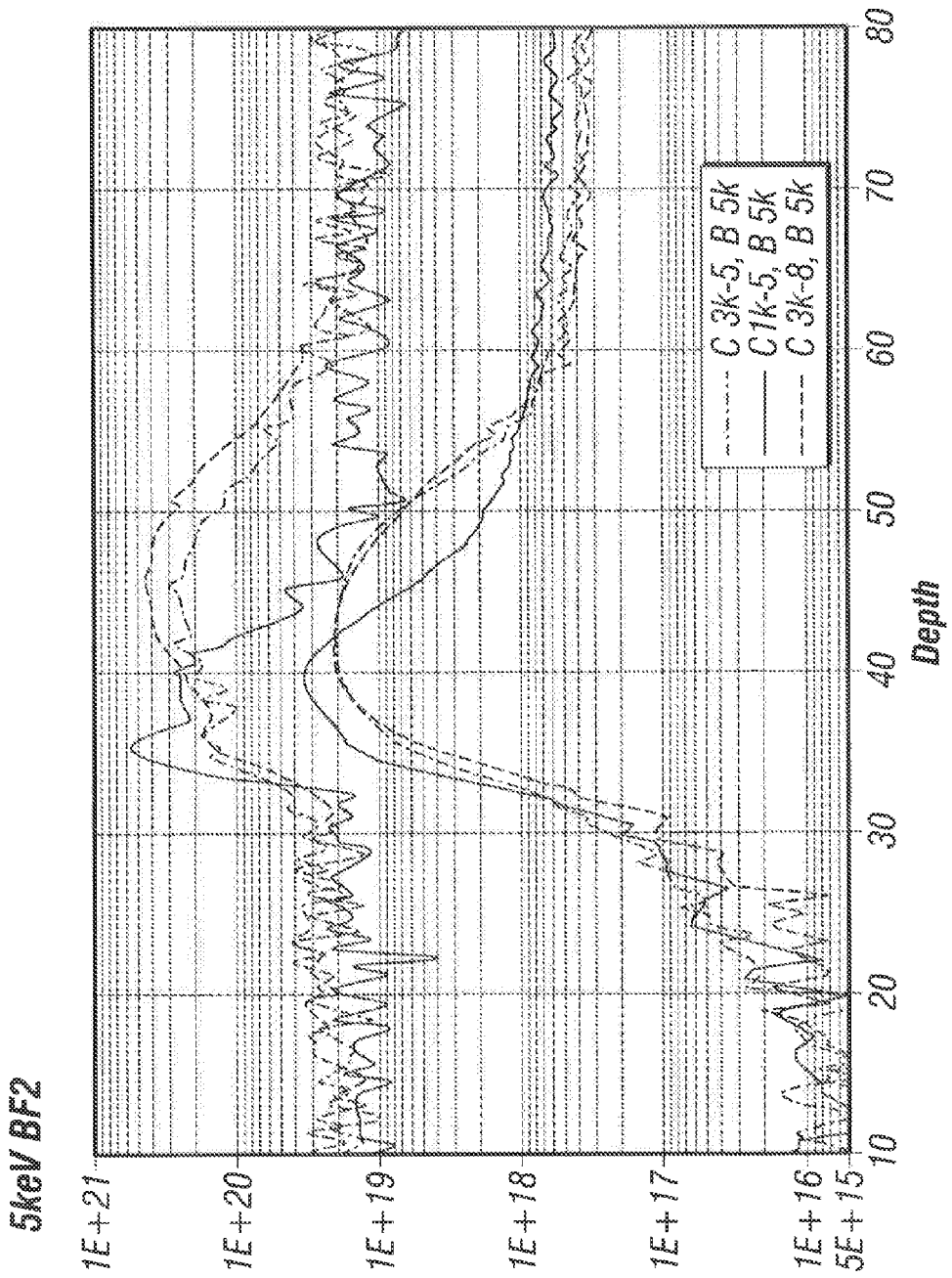
FIGS. 2A-2B illustrate examples of how a position and height of a peak of the dopant profile can be adjusted through a change in the carbon implant.

A Deeply Depleted Channel (DDC) transistor can use, among other things, dopants in preselected concentrations and located specific areas a distance below the top surface of the substrate to define a depletion zone and establish a threshold voltage during transistor operation. This can result in a transistor having improved electrical parameters including threshold voltage variation among transistors and reduced power requirements. One quality goal of a DDC transistor is to form the doped regions in such a manner as to inhibit the migration of the dopants outside of the desired locations.

A DDC transistor typically includes both a highly doped region formed in a semiconductor substrate below a gate, called the screening layer, that functions to define the extent of the depletion region below the gate in operation, and an undoped epitaxially grown channel on the highly doped region extending between a source and a drain of the transistor. In addition, a threshold voltage set layer may be positioned between the undoped channel and the screening layer and may alternatively contact or be separated from the screening layer and/or the undoped channel. This threshold voltage set layer is used to finely adjust or tune the threshold voltage of individual or blocks of transistors. The screening layer and/or the threshold voltage set layer can be implanted into the semiconductor substrate, separately grown as a blanket or as selective epitaxial layers on the semiconductor substrate and doped by controlled implants, or by substitutional doped deposition. The threshold voltage set layer may also be formed by performing a controlled diffusion from the screening layer. An anti-punchthrough layer may also underlie the screening layer and may be formed by implantation into the semiconductor substrate or by diffusion from the screening layer. As compared to conventional doped channel transistors, such DDC transistors can be more closely matched in device characteristics, in part because they have reduced channel random dopant fluctuations that can result in variable threshold voltage set points. Other embodiments of DDC transistors may include a slightly doped channel, whether by way of channel dopants distributed throughout or halo implants or other forms of channel doping. Further examples of a DDC transistor structure and manufacture are disclosed in U.S. Pat. No. 8,273,617 titled ELECTRONIC DEVICES AND SYSTEMS, AND METHODS FOR MAKING AND USING THE SAME by Scott E. Thompson et al., as well as U.S. patent application Ser. No. 12/971,884, filed on Dec. 17, 2010 titled LOW POWER SEMICONDUCTOR TRANSISTOR STRUCTURE AND METHOD OF FABRICATION THEREOF and U.S. patent application Ser. No. 12/971,955 filed on Dec. 17, 2010 titled TRANSISTOR WITH THRESHOLD VOLTAGE SET NOTCH AND METHOD OF FABRICATION THEREOF, the respective contents of which are incorporated by reference herein.

Thermal cycles in the fabrication process can lead to diffusion of the screening and threshold voltage set layer materials particularly when the materials used tend to be mobile. It is desirable to prevent screening layer and threshold voltage set layer materials from unwanted diffusion into the undoped channel layer. A method of reducing dopant migration is to introduce a dopant migration resistant material, such as carbon, to further limit unwanted dopant migration.

As an example, boron is preferably used for NMOS transistor fabrication. For a DDC NMOS transistor, a boron implant may be used for a screening layer and for the optional threshold voltage set layer. Implanted boron is widely known to diffuse during device fabrication, especially in thermal cycles of 900° C. or more. To avoid unwanted diffusion of boron, carbon may be added to the crystalline lattice. It is thought that carbon takes substitutional positions in the crystalline structure to limit available pathways for the movement of boron. There may be a pre-amorphization implant using germanium followed by a recrystallization anneal to enhance the effectiveness of the added carbon. The use of carbon addition to inhibit migration of dopants works effectively in a silicon crystalline substrate, and can be effective in other semiconducting substrates as well. Another benefit to using carbon implant is in its ability to tune the dopant profile of the boron.

FIGS. 1A-1C show by way of example how a carbon implant may be used to adjust a dopant profile of a boron used for a screening layer or a threshold voltage set layer of the DDC transistor. Throughout FIGS. 1A-1C, the dose of the boron implant is constant at $3.5 \times 10^{13}$ atoms/cm$^2$ to achieve a peak concentration as shown on the charts. In each of FIGS. 1A-1C, two dopant profiles are shown, one at a BF2 implant energy of 5 keV and one at an implant energy of 20 keV. Though results are shown for BF2, the effects shown herein apply to a boron implant as well. FIG. 1A shows the effect of a carbon implant at an implant energy of 3 keV and an implant dose of $5 \times 10^{14}$ atoms/cm$^2$ on the boron dopant profile. FIG. 1B shows the effect of a carbon implant at an implant energy of 1 keV and an implant dose of $5 \times 10^{14}$ atoms/cm$^2$ on the boron dopant profile. FIG. 1C shows the effect of a carbon implant at an implant energy of 3 keV and an implant dose of $8 \times 10^{14}$ atoms/cm$^2$ on the boron dopant profile.

As shown in FIGS. 1A-1C, the amount of implant energy for the carbon implant has a visible effect on the resultant boron dopant profile. For instance, as seen in FIG. 1B, a lower carbon implant energy, for instance, 1 keV, produces a sharper and higher peak in the boron dopant profile than for a carbon implant energy of 3 keV, where, as seen in FIGS. 1A and 1C, the boron dopant profile is more spread out. Moreover, boron dopant profile peak height and location may also be changed even when the carbon implant remains constant and the BF2 implant energy is adjusted. Another characteristic illustrated by FIGS. 1A-1C is that a tail of the dopant profile is affected by an amount of implant energy for the BF2 implant. Degradation of the dopant profile tail at lower implant energies for the BF2 implant may lead to higher drain induced barrier lowering (DIEL), greater short channel effects, and less threshold voltage response.

Figure 2B:
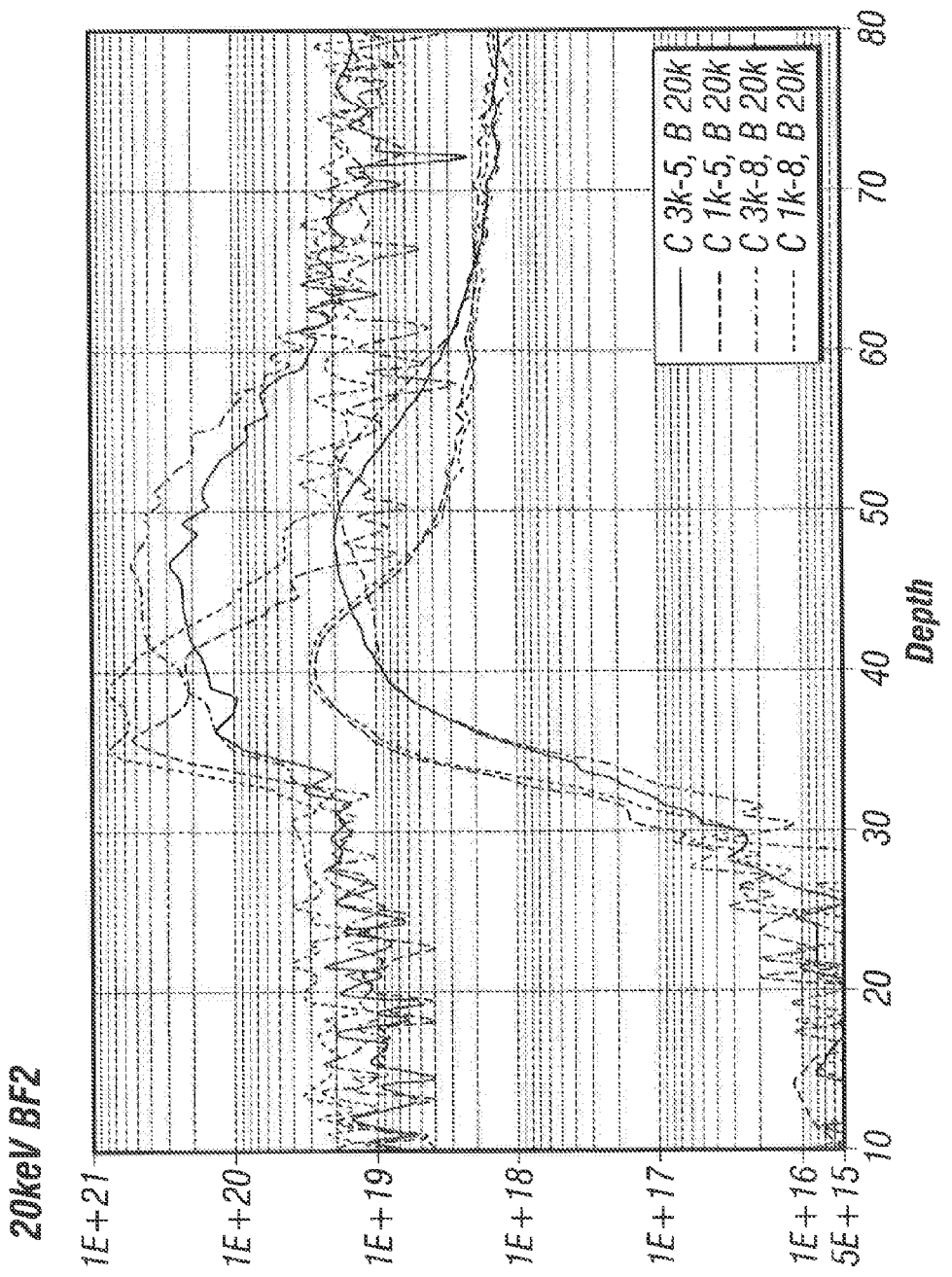

FIGS. 2A-2B show examples of how a position and height of a peak of the boron dopant, profile can be adjusted through a change in the carbon implant. The example of FIG. 2A uses BF2 as the dopant material implanted at an energy of 5 keV and a dopant implant dose of $3.5 \times 10^{13}$ atoms/cm$^2$. The peak of the boron dopant profile is sharper and higher and occurs at a shallower depth for a carbon implant energy of 1 keV as compared to keV. As a result, fine tuning of the boron dopant profile is achieved through variations in carbon implant parameters, with the carbon energy being tied to the sharpness of the peak for the boron profile. A lower carbon energy is used to attain a sharper boron peak. A lower carbon energy also causes the peak of the boron to be shallower and higher in concentration than for a higher carbon energy. Changes in carbon implant dose has a negligible effect on the boron dopant profile in this example, with very slight increases in peak height and sharpness of the dopant profile occurring at increased doses of the carbon implant. As a result, the boron dopant profile is more affected by carbon implant energy than carbon dopant concentration. However, increased carbon dopant concentration may protect the screening layer and the threshold voltage set layer from encroachment of subsequently formed lightly doped drain or source/drain extension regions.

The example of FIG. 2B uses BF2 as the dopant material implanted at an energy of 20 keV and a dopant implant dose of $3.5 \times 10^{13}$ atoms/cm$^2$. Similar changes in location and height of the peak of the dopant profile are achieved relative to carbon implant energy as similarly shown in FIG. 2A. Note that, as indicated in FIG. 2A-2B, a dual implant of carbon can be used to attain a dual peak profile for the boron. A lower-energy carbon, for instance, at an energy of about 1 keV, can be combined with a higher energy carbon, for instance, at an energy of about 3 keV, to produce a dual peak profile for the boron of a first, sharper, shallower peak and a second, wider, deeper peak. Finer dopant profile tuning can be made with modifications to the carbon dose.

FIGS. 3A-3F show an example of the changes that may take place in a transistor channel structure 300 during a fabrication process to produce the dopant profiles of FIGS. 1A-1C and 2A-2B. The process begins in FIG. 3A with a mask 302 formed on a semiconductor substrate 304 (preferably bulk silicon) to define an opening constituting an implant region 306. In one embodiment for an NMOS transistor device, a p-type material (for discussion purposes Boron or BF2) is implanted in the opening 306, at approximately 100-250 keV at doses in the range of $1 \times 10^{13}$ to $5 \times 10^{13}$ atoms/cm$^2$, to form a well 308.

Figure 3A:
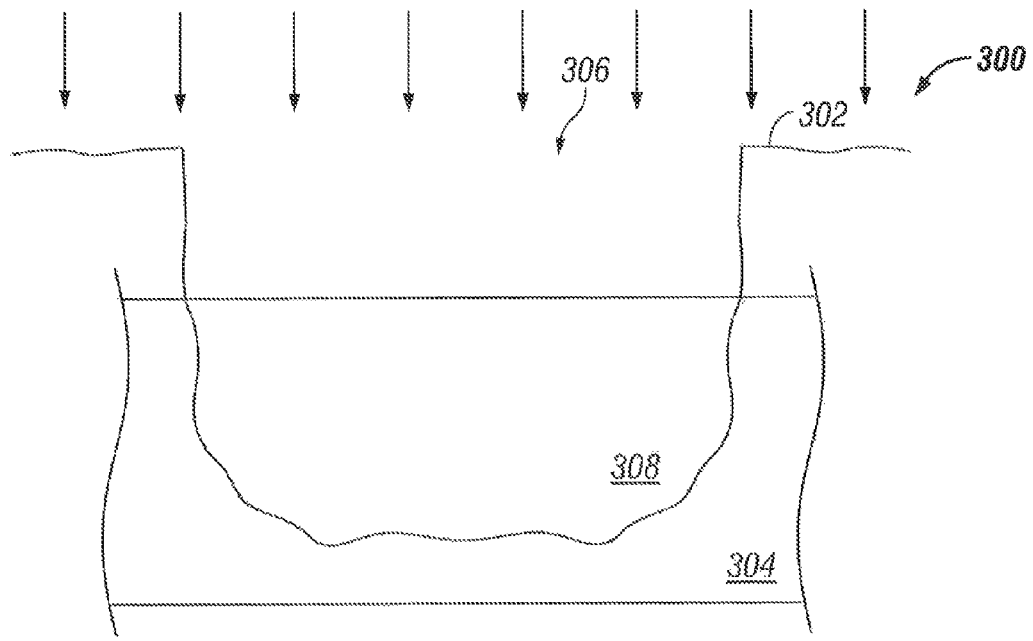
FIGS. 3A-3F illustrate changes in a transistor structure during a fabrication process to produce the dopant profiles of FIGS. 1A-1C and 2A-2B.
Figure 3B:
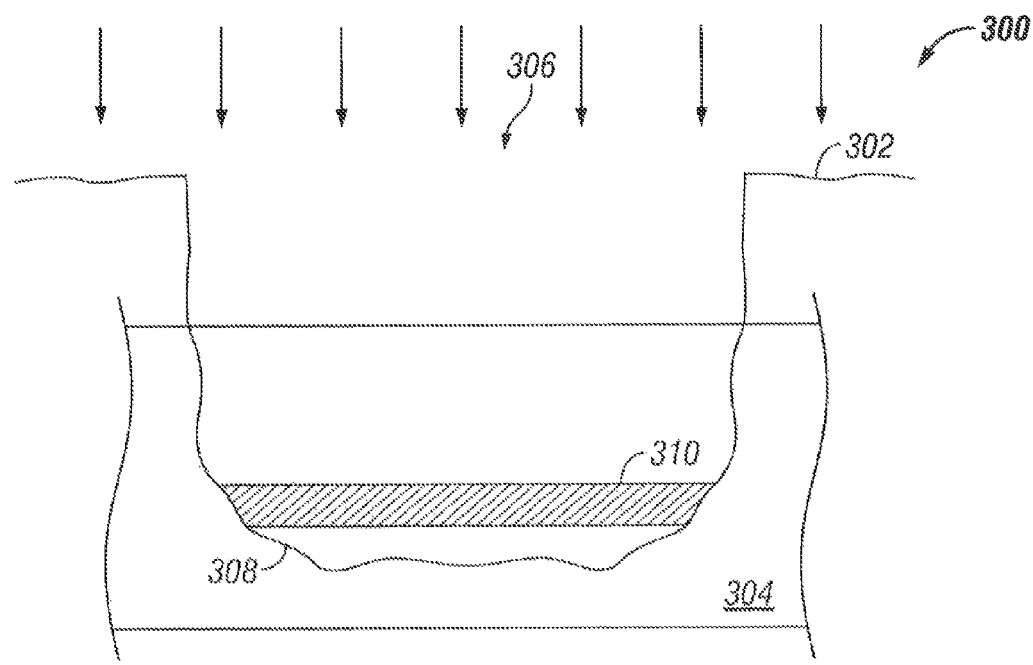

In FIG. 3B, an optional anti-punchthrough layer 310 comprising a p-type material may be implanted into opening 306. An example implant condition for anti-punchthrough layer 310 may include an implant energy of 30 to 50 keV and a dopant concentration of about 0.8 to $3.0 \times 10^{13}$ atoms/cm$^2$.

Figure 3C:
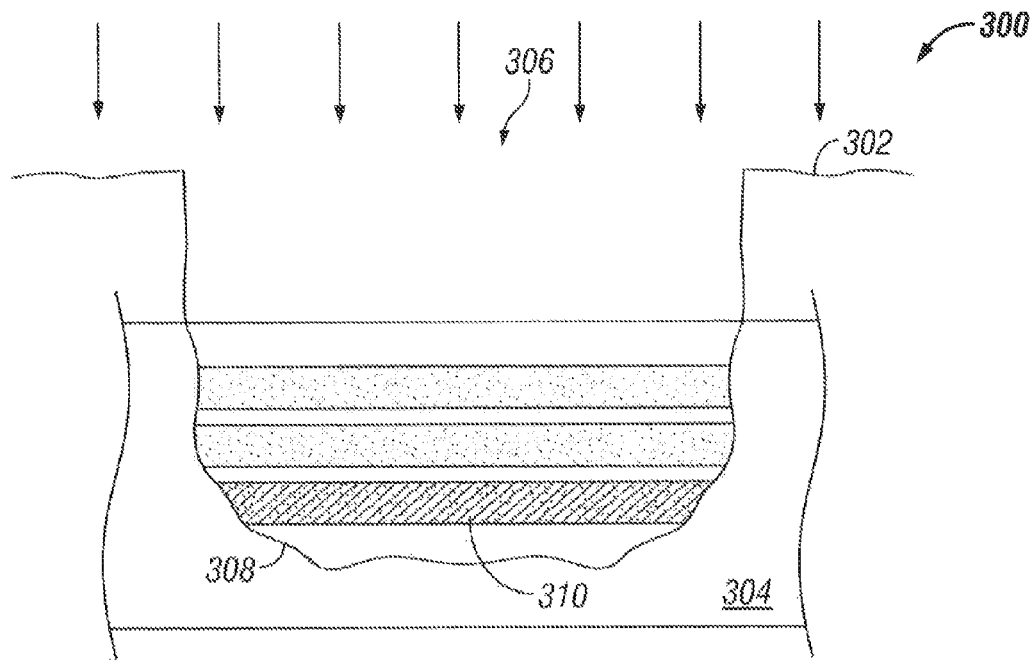

In FIG. 3C, dopant migration resistant material such as carbon is implanted into opening 306. An example process condition may include a germanium implant at an implant energy of 30 to 50 keV and a dopant implant dose of 4 to $6 \times 10^{14}$ atoms/cm$^2$. Multiple carbon implants may be performed for further dopant profile tuning as desired. For instance, each carbon implant can correspond respectively to one or more of anti-punchthrough layer 310 and a subsequently formed screening layer and a subsequently formed threshold voltage set layer. The process conditions for the carbon implants may include those discussed above, with energy selections tailored to tune the dopant profile of the anti-punchthrough layer 310, the screening layer, the threshold voltage set layer and any other desired profiles. The carbon implant may be performed once for all dopant profile tunings, or may be performed in steps specifically matched to steps for one or more of the dopant regions. Notably, the dopant profile shape for one or more screening layers and if present, the threshold voltage set layer are designed for the transistor to meet its parametric requirements. Therefore, implementing a process that matches an appropriate carbon implant energy to targeted dopant profile shapes is beneficial for achieving structural and device metric goals for the transistor. Example carbon implant conditions may include an implant energy of 0.8 to 8 keV and a dopant implant dose of $3 \times 10^{13}$ to $8 \times 10^{14}$ atoms/cm$^2$. A particularly shallow carbon implant may serve an additional benefit to contain the profile of the to-be-formed source/drain extensions (shown as 322, 324 in FIG. 3F). A deeper carbon implant may be used to control the shape of a more deeply implanted dopant, for example anti-punchthrough layer 310. The carbon implant conditions are selected to place a peak of the dopant profile of the anti-punchthrough layer 310, the screening layer, and the threshold voltage set layer at a desired location and height.

After the germanium and carbon implants, transistor structure 300 is usually subjected to one or more annealing processes. Example annealing processes include baking transistor structure 300 at a temperature of 600 to 700° C. for 80 to 200 seconds. A spike anneal may also be performed at an example temperature of 900 to 1100° C. for a duration of less than 1 second. The anneal processes are selected and performed to recrystallize the semiconductor substrate while suppressing diffusion of implanted dopants.

Figure 3D:
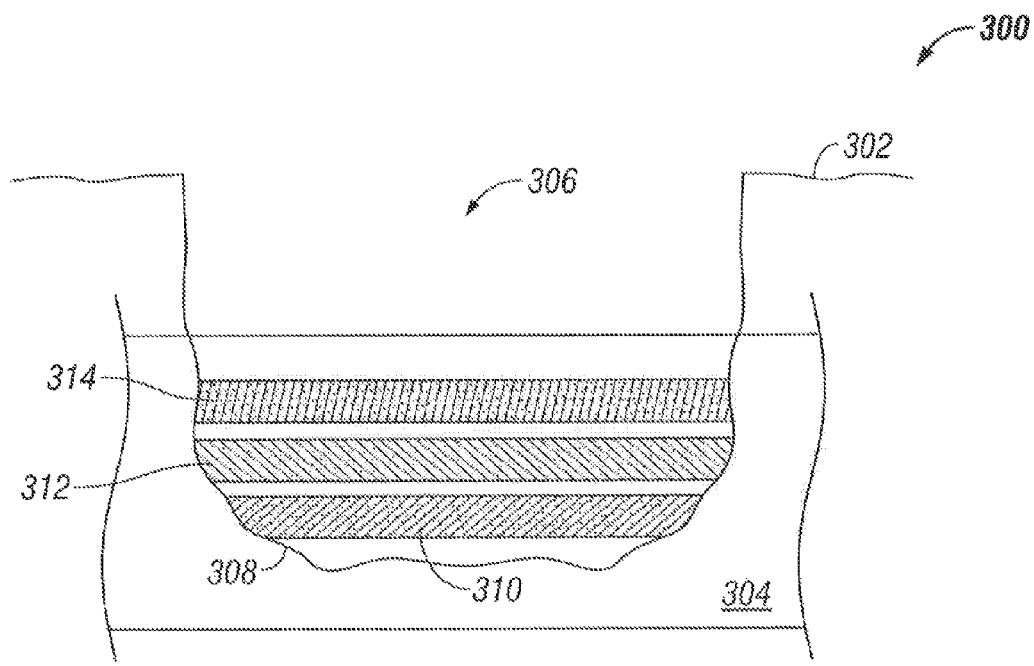

In FIG. 3D, a screening layer 312 and a threshold voltage set layer 314 are implanted into implant region 306. In an alternative process, anti-punchthrough layer 310 may also be implanted at this time instead of prior to the germanium implant as stated above. Example implant conditions include those discussed above where screening layer 312 may be implanted with a p-type material at an implant energy of 10 to 30 keV and a dopant implant dose of 2 to $5 \times 10^{13}$ atoms/cm$^2$. Threshold voltage set layer 314 may be implanted with a p-type material at an implant energy of 3 to 20 keV and a dopant implant dose of 1 to $4 \times 10^{13}$ atoms/cm$^2$. In alternative embodiments, screening layer 312 may have a higher dopant concentration, approximately the same, or lower dopant concentration than that of threshold voltage set layer 314 so that the screening layer 312 may be below or above the threshold voltage set layer 314. The desired peak sharpness of the screening layer 312 and threshold voltage set layer 314 are modulated by setting the carbon implant energy that matches the desired outcome, that is a lower carbon implant energy resulting in sharper, higher peaks with a more narrow profile. Typically, the dopant concentration of the anti-punchthrough layer 310 is lower than both the screening layer 312 and threshold voltage set layer 314. Implantation of screening layer 312 and threshold voltage set layer 314 may be performed in separate implant steps or as a single continuous step through dynamic adjustment of the process conditions.

Figure 3E:
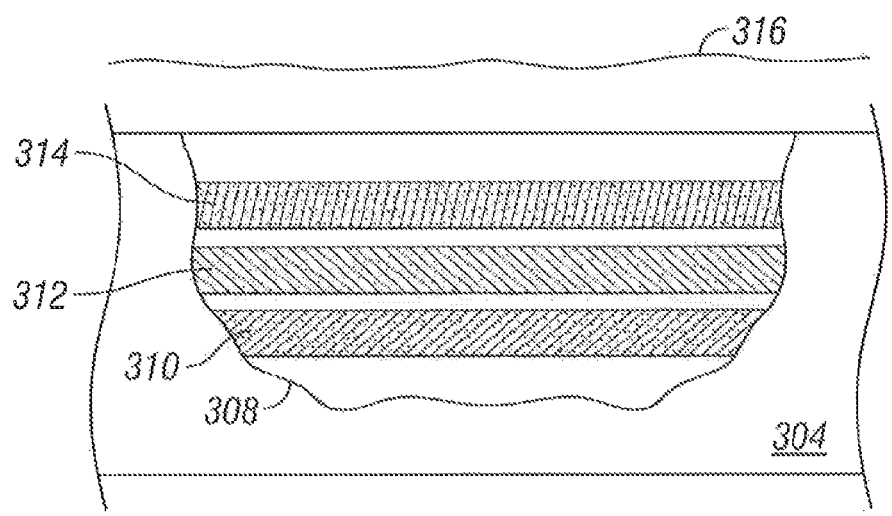

In FIG. 3E, following screening layer 312 and threshold voltage set layer 314 implantation, transistor structure 300 may be subject to one or more anneal processes as discussed above in order to further prevent diffusion of the dopants in these layers. Mask 302 is removed and a blanket undoped channel layer 316 may then be epitaxially grown across a plurality of transistor structures 300 on a single die (not shown).

Figure 3F:
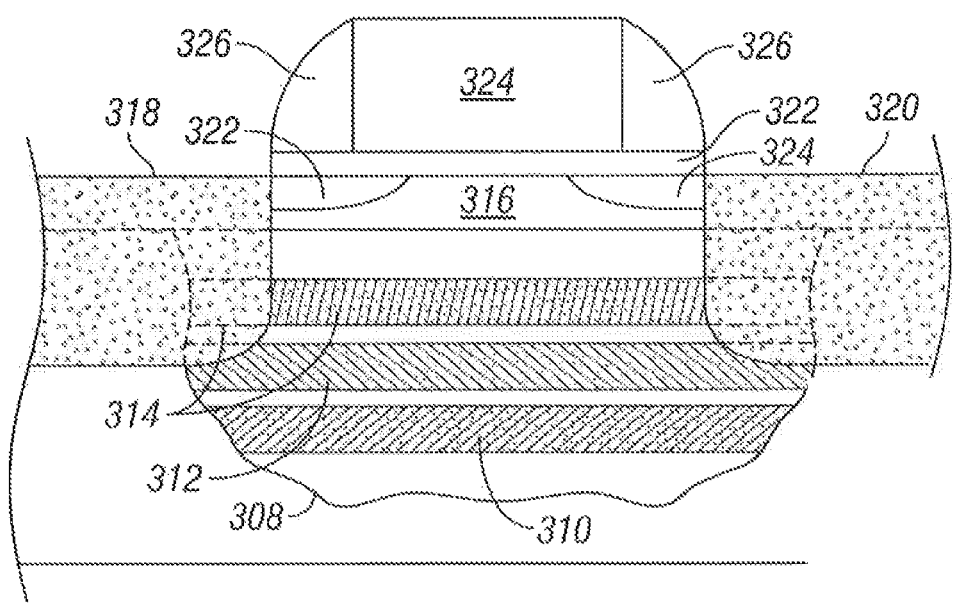

In FIG. 3F, a gate dielectric 322, a gate region 324, and sidewall spacers 326 may be formed over undoped channel 316. Note that although a planar CMOS structure is depicted in the FIGURE, alternative transistor structures above the channel 316 may be formed. An n-type material may be implanted to form a source extension 322 and drain extension 324 as well as a source region 318 and a drain region 320.

The above embodiments for using a diffusion-mitigating material in the context of DDC transistors is applicable for both NMOS and PMOS transistors, though typically, such methods may be used more commonly for NMOS and less commonly for PMOS. For PMOS, other materials which in themselves tend to be less diffusive may be used. For instance, antimony may be used for the highly doped regions of the PMOS transistor, thus making potentially unnecessary the use of further diffusion-mitigation measures. For PMOS, energy and dose levels for ion implantation of the dopant material (for instance, antimony) are selected to effect a targeted placement of the profile peak as well as thickness and concentration of the doped region, all of which can affect resultant electrical parameters for the transistor including threshold voltage, junction leakage, drive current, drain-induced barrier lowering, and other parameters. However, an alternative embodiment may be to deposit a blanket epitaxial carbon-infused silicon on the substrate surface in advance of or after the doping of the highly doped regions (for instance, the screen layer and the threshold voltage setting layer). Such a blanket epitaxial carbon-infused silicon may serve as an overall dopant migration inhibitor for all devices. Implanted dopant migration mitigation material (for instance, carbon) may be used to augment in-situ epitaxially grown material as needed. Adjacent transistor structures 300 may be separated by isolation regions 326, with the isolation regions being preferably formed after the epitaxial layer is formed. Further conventional process steps can then be performed to complete the fabrication to form an integrated circuit.

As a further note, as shown in FIG. 4, preselected carbon implants may be performed in the absence of a screening layer or threshold voltage tuning layer (not shown). There is provided a transistor 400 which contains, in this example, a gate 402 and spacer structures 404 on either side of gate 402 overlying a gate dielectric 406 which may be a thermally grown oxide or other suitable material. There may be source and drain extension structures 410 and 412 extending below and near the edges of gate 402 with spacers 404. There may be deeper source and drain structures 420 and 422, doped to a level sufficient to provide a suitable contact to metallization which may be formed thereabove (not shown).

There may not be an undoped epitaxially grown channel as preferably used for DDC transistor structures. Carbon addition 430 may be made by ion implantation directly into substrate 428 which may be previously doped with wells (not shown) or the wells may be formed after the carbon implants. Instead of implanted carbon, carbon addition 430 may be epitaxially introduced by way of an epitaxial material growth over substrate 428 that includes carbon, resulting in carbon addition 430 appearing in the channel. A benefit of using carbon-added epitaxially grown silicon is the avoidance of using germanium pre-amorphization implants. If instead, carbon is put into the substrate by way of ion implantation, then germanium pre-amorphization may be typically followed by recrystallization anneal to secure the carbon into the substitutional lattice locations. Germanium pre-amorphization implant may, however, be avoided with the selection of an appropriate ion implantation process for the carbon, for instance through use of low-temperature ion implantation methods.

Preselected carbon implants (the process shall be referred to herein as "implants" though in-situ epitaxially introduced carbon alone or in combination with ion implantation of carbon may be used) may be used in the context of a DDC transistor, with conventional channel doping implementations or halo doping implementations, or both. The carbon is introduced into substrate 428 so that the carbon concentration and, as applicable, the profile may be matched to those areas of the source 420, drain 422, source extension 410, and drain extension 412 tending to produce unwanted out-diffusion. Typically, carbon may be added to substrate 428 uniformly in the deep source 420/drain 422 area with the concentration being modulated at the source extension 410/drain extension 412 area to fine-tune the electrical parameters of the transistor device which may be affected by tolerance for more or less out-diffusion of material from the doped areas 410, 412, 420 and 422.

Preselected carbon implants may be used with the isolation structures formed first or right after placement of carbon addition 430, or sometime later in the fabrication process sequence. Preferably, the isolation structures are formed after the carbon implants.

Energy for implanting the carbon implants may range from 0.5 to 10 keV for a dose of $8 \times 10^{13}$ to $2 \times 10^{15}$ atoms/cm$^2$ or other dose to result in a sufficient concentration of carbon to effect a stop for potential diffusion of the later formed source 420, drain 422, source extension 410, and drain extension 412. Concentration of the carbon in the semiconductor lattice may be, for instance, $1 \times 10^{18}$ atoms/cm$^3$ to $8 \times 10^{20}$ atoms/cm$^3$ where the concentrations may be more precisely located to be in the vicinity of the source extension 410/drain extension 412 or source 420/drain 422. The carbon concentration and location of concentration profile peaks can be tuned with the selection of energies and dose, as can be seen in the examples of FIGS. 1A TO 1C, and FIGS. 2A TO 2B. If a dual carbon profile is desired, the profile can be achieved using a combination of ion implant steps or using a combination of in-situ carbon epitaxial growth at a designated carbon concentration with separately performed ion implantation.

A benefit of using carbon implants in the channel is multifold. In the case of DDC transistors, carbon helps to mitigate against unwanted diffusion doped regions to effect a desired and specific dopant profile. In the case of conventional transistors, there is usually a greater problem of out-diffusion from the source and drain structures due to high temperature anneals that take place later in the process sequence. The high temperature anneals may cause excessive out-diffusion of material, for instance boron or phosphorous, from the source and drain structures. By introducing carbon into the channel prior to the initiation of the anneals that may cause excessive out-diffusion of the source and drain into the channel region, the otherwise occurring out-diffusion of material from the source and drain structures can be mitigated. Though the carbon implants may be formed at any time prior to the problematic anneals, the carbon implants are preferably formed together with, before, or right after the formation of the wells.

Note that although a well-known structure for a MOSFET is shown in FIG. 4, the embodiment of placing carbon into the channel is useful for a variety of MOSFET structures including structures having shallower junction, raised source and drain, source and/or drain structures created with selective epitaxial growth, having or not having source/drain extensions, or other variations thereof. Placing carbon in the channel is useful for either NMOS or PMOS, and carbon placement to tune dopant profile of adjacent doped structures can be used in non-MOSFET contexts as well, for instance in bipolar or other structures that involve doped regions that should remain in place. Carbon in the channel is useful for numerous types of DDC structures as described above in relation to FIGS. 1A to 1C, 2A to 2B, and 3A to 3F, as well as the previous cases incorporated by reference herein. Carbon in the channel may also be used in three-dimensional transistor structures, for instance finFET devices, where it is desired to block the out-diffusion of source/drain dopant material into a non-doped, lesser doped, or oppositely doped area.

Different process conditions for doping may be implemented across a plurality of transistors in a die. Through selective use of doping conditions across a plurality of transistors, transistor structures may be fabricated with variations in location and height of the peak of the dopant profile so as to effect differing electrical transistor behaviors. Doping conditions within the channel may directly affect certain electrical properties such as threshold voltage. Doping profile of other parts of the transistor, for instance the source and drain, should also be controlled, though out-diffusion that results in a modification of the shape of the source and drain can create problems with transistors not meeting parametric targets. The use of carbon or other dopant migration mitigation materials is effective to hold a dopant material that would otherwise travel through a semiconductor lattice in place to effect a dopant desired profile. More specifically, the use of preselected carbon process conditions to effect a placement of carbon into the substrate has beneficial effects on keeping the target shape for the doped areas. If ion implantation is used for introducing the carbon, the modulation of energy of the implant results in a certain shape of a dopant profile peak. To insert carbon into the substrate, ion implantation, in-situ epitaxial growth, or other methods or combinations thereof may be used to effect a placement of a concentration of carbon species in desired locations.

Although the present disclosure has been described in detail with reference to a particular embodiment, it should be understood that various other changes, substitutions, and alterations may be made hereto without departing from the spirit and scope of the appended claims. For example, although the present disclosure includes a description with reference to a specific ordering of processes, other process sequencing may be followed to achieve the end result discussed herein. Though discussed using specific examples, different materials and process conditions may be used at each point of the fabrication process to create a desired transistor structure. As but one example, the carbon implants may be intermixed with the various boron implants.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for fabricating a transistor device having a gate, a channel, a source and a drain on either side of the channel, the channel having a tuned dopant profile, comprising:
    defining an implant region;
    performing a first implantation of a first dopant migration mitigating material into the implant region at a first preselected dopant migration mitigating energy and dose;
    implanting a screening layer into the implant region at a preselected screening layer energy and screening layer dose, the screening layer defining a depletion width for the transistor channel when a voltage is applied to the gate;
    implanting a threshold voltage set layer into the implant region at a preselected threshold voltage set layer energy and threshold voltage set layer dose;
    wherein the first preselected dopant migration mitigating energy effects the placement of a peak of a dopant profile of the screening layer at a first location and a first thickness;
    wherein the preselected threshold voltage set layer energy and threshold voltage set layer dose effects the placement of the peak of a dopant profile of the threshold voltage layer to be different from the first location;
    wherein the threshold voltage set layer is coextensive with the screening layer and abuts the source and drain and the screening layer extends laterally across the channel.

2. The method of claim 1, further including the step of performing a second implantation of a second dopant mitigating material at a second preselected dopant mitigating material energy and dose.

3. The method of claim 2, wherein the first implantation of a dopant migration mitigating material is implanted at a first energy and the second implantation of a dopant migration mitigating material is implanted at a second energy, the first energy being lower than the second energy.

4. The method of claim 2, wherein both the first dopant migration mitigating material and second dopant migration mitigating material comprise carbon.

5. The method of claim 4, wherein the first implantation is at a first energy, and the second implantation is at a second energy, the second energy being higher than the first energy.

6. The method of claim 1, wherein the first and second energies for the first and second dopant migration mitigating material implantations are identical.

7. The method of claim 1, wherein the first dopant migration mitigating material comprises carbon.

8. The method of claim 1, further comprising:
    creating a narrower peak profile for the screening layer compared with the threshold voltage set layer.

9. The method of claim 1, further comprising:
    implanting an anti-punchthrough layer into the implant region.

10. The method of claim 1, further comprising:
    forming an undoped channel layer on the implant region.

11. A method for fabricating transistor devices with tuned dopant profiles, comprising:
    providing a first implant region for a first transistor device;
    performing a first implantation of a carbon material into the first implant region;
    performing a second implantation of a carbon material into the first implant region;
    implanting a first screening layer into the first implant region;

providing a second implant region for a second transistor device;

implanting a second screening layer into the second implant region;

wherein process conditions for implanting the first implantation of a carbon material and the second implantation of a carbon material and the first screening layer are selected to effect a location of a peak and thickness of a dopant profile of the first screening layer;

wherein process conditions for implanting a second screening layer are selected to effect a location of a peak and thickness of a dopant profile of the second screening layer.

12. The method of claim 11, further including the step of implanting a first threshold voltage layer into the first implant region.

13. The method of claim 11, further including the step of implanting a second threshold voltage layer into the second implant region.

14. The method of claim 11, further comprising:

selecting a lower energy for the first implantation and a higher energy for the second implantation, resulting in a narrower peak profile for the first screening layer as a result of the selection of the lower energy for the first implantation.

* * * * *